(12) United States Patent
Endo et al.

(10) Patent No.: US 12,183,840 B2
(45) Date of Patent: Dec. 31, 2024

(54) SOLAR CELL AND SOLAR CELL MODULE

(71) Applicant: Shin-Etsu Chemical Co., Ltd., Tokyo (JP)

(72) Inventors: Yoko Endo, Annaka (JP); Hiroyuki Otsuka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/892,663

(22) Filed: Feb. 9, 2018

(65) Prior Publication Data

US 2018/0175223 A1 Jun. 21, 2018

Related U.S. Application Data

(62) Division of application No. 14/439,344, filed as application No. PCT/JP2013/074979 on Sep. 17, 2013, now abandoned.

(30) Foreign Application Priority Data

Nov. 1, 2012 (JP) .................................. 2012-241498
Aug. 21, 2013 (JP) .................................. 2013-171202

(51) Int. Cl.
*H01L 31/0224* (2006.01)
*H01L 31/048* (2014.01)
(Continued)

(52) U.S. Cl.
CPC .... *H01L 31/022433* (2013.01); *H01L 31/048* (2013.01); *H01L 31/0504* (2013.01); *H01L 31/068* (2013.01); *Y02E 10/547* (2013.01)

(58) Field of Classification Search
CPC ............. H01L 31/0201; H01L 31/0224; H01L 31/022433; H01L 31/18; H01L 31/048;
(Continued)

(56) References Cited

U.S. PATENT DOCUMENTS

| | | | |
|---|---|---|---|
| 4,590,327 A | 5/1986 | Nath et al. | |
| 6,414,235 B1 | 7/2002 | Luch | |

(Continued)

FOREIGN PATENT DOCUMENTS

| | | |
|---|---|---|
| CN | 202058745 U | 11/2011 |
| JP | 55-139560 U | 10/1980 |

(Continued)

OTHER PUBLICATIONS

International Search Report dated Nov. 5, 2013, issued in corresponding application No. PCT/JP2013/074979.

(Continued)

*Primary Examiner* — Angelo Trivisonno
(74) *Attorney, Agent, or Firm* — WHDA, LLP

(57) ABSTRACT

Provided is a solar cell that includes: a semiconductor substrate on which at least pn junctions are formed; a multiplicity of finger electrodes that are formed in a comb-like shape on at least one surface of the semiconductor substrate; and a plurality of bus bar electrodes that are arranged so as to be orthogonal to the lengthwise direction of the finger electrodes and are connected with the finger electrodes. This solar cell is configured so that the finger electrodes connected with one of the bus bar electrodes are separated from the finger electrodes connected with another bus bar electrode that is arranged so as to be parallel to this one of the bus bar electrodes, and ends in the lengthwise direction of adjacent two or more of the finger electrodes connected with each bus bar electrode are electrically connected with one another by auxiliary electrodes. With this configuration, while disadvantage due to disconnection is solved, a high fill factor, a high conversion efficiency, and small cell warpage are achieved, whereby the manufacturing yield is improved. Further, this does not involve increases in costs, and high long-term reliability is achieved. Thus, a (Continued)

solar cell module made up of the solar cells maintains high output.

14 Claims, 5 Drawing Sheets

(51) Int. Cl.
  *H01L 31/05* (2014.01)
  *H01L 31/068* (2012.01)
(58) Field of Classification Search
  CPC . H01L 31/0504; H01L 31/068; Y02E 10/547; Y02E 10/50
  See application file for complete search history.

(56) References Cited

U.S. PATENT DOCUMENTS

| | | | |
|---|---|---|---|
| 6,573,445 B1 | 6/2003 | Burgers | |
| 2008/0149161 A1 | 6/2008 | Nishida et al. | |
| 2010/0084004 A1 | 4/2010 | Ortabasi | |
| 2011/0020976 A1* | 1/2011 | Watai | H01L 31/02168 438/72 |
| 2011/0056554 A1* | 3/2011 | Yamamoto | H01L 31/022425 136/256 |
| 2011/0076417 A1* | 3/2011 | Matsuda | C23C 18/143 427/532 |
| 2011/0277835 A1 | 11/2011 | Masson et al. | |
| 2014/0096823 A1 | 4/2014 | Fu et al. | |

FOREIGN PATENT DOCUMENTS

| | | |
|---|---|---|
| JP | 9-283781 A | 10/1997 |
| JP | H11-298019 A | 10/1999 |
| JP | 2003-086818 A | 3/2003 |
| JP | 2005-317904 A | 11/2005 |
| JP | 2008-135655 A | 6/2008 |
| JP | 2009-295715 A | 12/2009 |
| JP | 2010-239167 A | 10/2010 |
| JP | 2012-124328 A | 6/2012 |
| JP | 2006-324504 A | 11/2015 |
| WO | 2009006230 A2 | 1/2009 |

OTHER PUBLICATIONS

Notification of Reasons for Refusal dated Oct. 27, 2015, issued in counterpart Japanese Patent Application No. 2014-544377 (2 pages).
Office Action dated Mar. 24, 2016, issued in counterpart Chinese Application No. 201380056984.9 (6 pages).
Singaporean Written Opinion dated Jun. 21, 2016, issued in counterpart Singaporean application No. 11201503391Q. (6 pages).

* cited by examiner

SOLAR CELL AND SOLAR CELL MODULE

CROSS-REFERENCE TO RELATED APPLICATIONS

This is a divisional of U.S. application Ser. No. 14/439,344, filed on Apr. 29, 2015, which is a 371 of PCT/JP2013/074979, filed on Sep. 17, 2013, which claims the benefit of priority over Japanese Application No. 2012-241498 filed on Nov. 1, 2012 and Japanese Application No. 2013-171202 filed on Aug. 21, 2013, the entire contents of which are incorporated herein by reference.

TECHNICAL FIELD

This invention relates to a solar cell which has long-term reliability and high conversion efficiency and maintains high output, and a solar cell module comprising solar cells arranged in series.

BACKGROUND ART

Using a prior art technique, a solar cell is generally manufactured as shown in FIGS. 1 to 3. In a p-type semiconductor substrate 100b of silicon or the like, an n-type dopant is diffused to form an n-type diffusion layer 101 to define a pn junction. On the n-type diffusion layer 101, an antireflection coating layer 102 such as SiNx film is formed. On the rear side (lower side in FIG. 1) of the p-type semiconductor substrate 100b, aluminum paste is printed over substantially the entire surface and alloyed into silicon to form a back surface field (BSF) layer 103 and an aluminum electrode 104 by firing. Further, for current collection on the rear side, a conductive paste containing silver or the like is printed and fired to form a thick electrode 106 which is known as bus bar electrode. On the light-receiving surface side (upper side in FIG. 1, on the antireflection coating layer 102), finger electrodes 107 for current collection and thick electrodes formed for collecting current from the finger electrodes known as bus bar electrodes 105 are arranged in comb-grid shape so that they intersect substantially at right angles.

The contact resistance between the front finger electrodes 107 and the semiconductor substrate 100b and the line resistance of electrodes have a large impact on the conversion efficiency of the solar cell. To gain high efficiency (low cell series resistance and high curve fill factor (FF)), it is required that the contact resistance and the line resistance of finger electrodes 107 are of fully low values.

Meanwhile, screen printing method is often employed as the electrode forming method for solar cells. The screen printing method has advantages including ease of formation of printed pattern, an ability to adjust printing pressure to minimize substrate damage, a high working speed per cell, low cost and high productivity. If a conductive paste which is so thixotropic that the profile may be maintained even after transfer is used, electrodes having a high aspect ratio can be formed.

Nevertheless, there are some problems. In general, silicon (Si) is used for the solar cell substrate while Al, Ag and the like are used for the electrode material. When conductive paste is printed and sintered onto the solar cell substrate, warpage occurs due to a difference of linear expansion coefficient between the Si substrate and the electrode material such as Al or Ag. Also, ends of finger electrodes may be peeled off due to shortage of adhesive strength, whereby solar cell performance is degraded.

As a countermeasure, as shown in FIG. 4, finger electrodes 107, 107 connected to bus bar electrodes 105, 105 are shortened such that distal ends of finger electrodes 107, 107 are spaced apart, thereby reducing warpage. This, however, induce disconnection of the finger electrodes 107 between bus bar electrodes 105, 105. Since the number of distal ends of finger electrodes is doubled as compared with the finger electrodes in FIG. 1, a peeling failure rate of distal ends may increase. It is also proposed in JP-A 2006-324504 to enlarge the width (or area) of the distal portions of finger electrode to increase the adhesive area, for thereby increasing the adhesive strength. Surely the adhesive strength of distal portions of the finger electrode is increased. This method succeeded in mitigating the warpage of solar cell substrate and increasing the adhesive strength of finger electrodes, but failed to avoid the increase of line resistance due to local breaks in finger electrodes and the problem of reduced fill factor.

Specifically, the finger electrodes are typically designed to a line width of about 60 to 120 μm. They are printed and formed by the screen printing method as mentioned above. Such reduced line width may induce problems like skipping, further narrowing of line width, and breakage. Such failure, if any, may lead to the problem of interfering with electric conduction from the finger electrode at the failed site to the bus bar electrode.

CITATION LIST

Patent Document

Patent Document 1: JP-A 2006-324504

SUMMARY OF INVENTION

Technical Problem

An object of the invention, which has been made under the above-mentioned circumstances, is to provide a solar cell and a solar cell module, featuring mitigated warpage of a solar cell substrate against high adhesive strength of distal portions of finger electrodes and possible electric conduction of a finger electrode to a bus bar electrode even if the electrodes are locally cut or broken, eventually having long-term reliability and high conversion efficiency, and maintaining high output.

Solution to Problem

To attain the above object, the invention provides a solar cell and solar cell module as defined below.

[1] A solar cell comprising a semiconductor substrate having at least a pn junction formed therein, a multiplicity of finger electrodes which are formed in comb shape on at least one surface of the semiconductor substrate, and a plurality of bus bar electrodes which extend orthogonal to the longitudinal direction of the finger electrodes and are connected to the finger electrodes, wherein first finger electrodes which are connected to a first bus bar electrode are spaced apart from second finger electrodes which are connected to a second bus bar electrode extending parallel with the first bus bar electrode, and longitudinal ends of adjacent two or more of the finger electrodes connected to each bus bar electrode are electrically connected together by an auxiliary electrode.

[2] The solar cell of [1] wherein longitudinal ends of adjacent two to four of the finger electrodes connected to each bus bar electrode are connected together by an auxiliary electrode.

[3] The solar cell of [1] wherein all adjacent longitudinal ends of the finger electrodes connected to each bus bar electrode are connected together by an auxiliary electrode.

[4] The solar cell of any one of [1] to [3] wherein the finger electrodes project from the bus bar electrode to which they are connected, in opposite directions orthogonal to the bus bar electrode, and at each of the opposite ends of the finger electrodes projecting from the bus bar electrode, longitudinal ends of adjacent finger electrodes are electrically connected together by an auxiliary electrode.

[5] The solar cell of any one of [1] to [4] wherein at a position other than the longitudinal end of the finger electrodes, adjacent finger electrodes connected to a common bus bar electrode are electrically connected by another auxiliary electrode extending orthogonal to the longitudinal direction of the finger electrodes.

[6] The solar cell of [5] wherein 1 to 10 auxiliary electrodes are provided at a position other than the longitudinal end of the finger electrodes.

[7] The solar cell of any one of [1] to [6] wherein the finger electrode has a width of 30 to 120 μm.

[8] The solar cell of any one of [1] to [7] wherein the auxiliary electrode has a width of 30 to 500 μm.

[9] A solar cell module comprising a plurality of solar cells as set forth in any one of [1] to [8] wherein their bus bar electrodes are connected in series.

Advantageous Effects of Invention

The solar cell of the invention eliminates drawbacks associated with breaks of finger electrodes and offers a high fill factor, high conversion efficiency, mitigated cell warpage, improved manufacture yield, least cost increase, and long-term reliability. The solar cell module comprising such solar cells has a high percent output retention.

DESCRIPTION OF EMBODIMENTS

Below, the solar cell and solar cell module according to the invention are described. Understandably, the invention is not limited to the solar cells of the illustrated embodiments.

Figure 1:
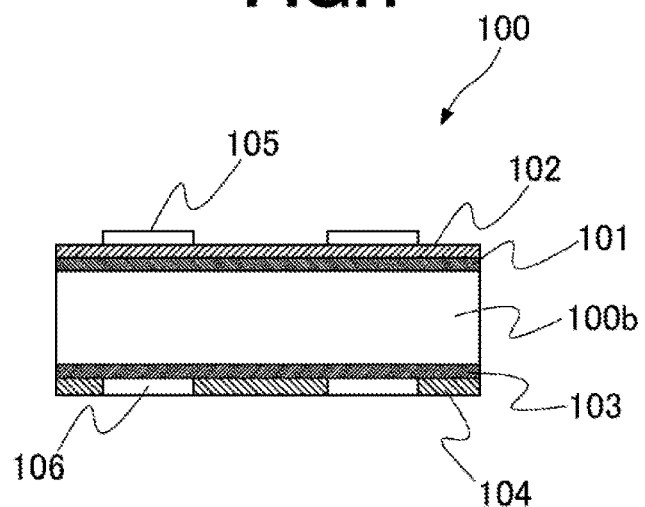
FIG. 1 is a cross-sectional view showing the construction of a conventional solar cell.

Referring to FIGS. 5 to 8, the solar cell of the invention is illustrated as comprising a semiconductor substrate having at least a pn junction formed therein, a multiplicity of finger electrodes 107a, 107b which are formed in comb shape on at least one surface of the semiconductor substrate, and a plurality of (two in FIGS. 5 to 8) bus bar electrodes 105a, 105b which extend orthogonal to the longitudinal direction of the finger electrodes 107a, 107b and are connected to the finger electrodes 107a, 107b. Herein, first finger electrodes 107a which are connected to a first bus bar electrode 105a are spaced apart from second finger electrodes 107b which are connected to a second bus bar electrode 105b extending parallel with the first bus bar electrode 105a, and longitudinal ends (also referred to as distal portions, hereinafter) of adjacent two or more electrodes of the finger electrodes connected to each bus bar electrode are electrically connected together by an auxiliary electrode 108. It is noted that the solar cell of the invention is characterized by the front surface electrode pattern while the remaining construction may be as shown in FIG. 1, for example.

Figure 5:
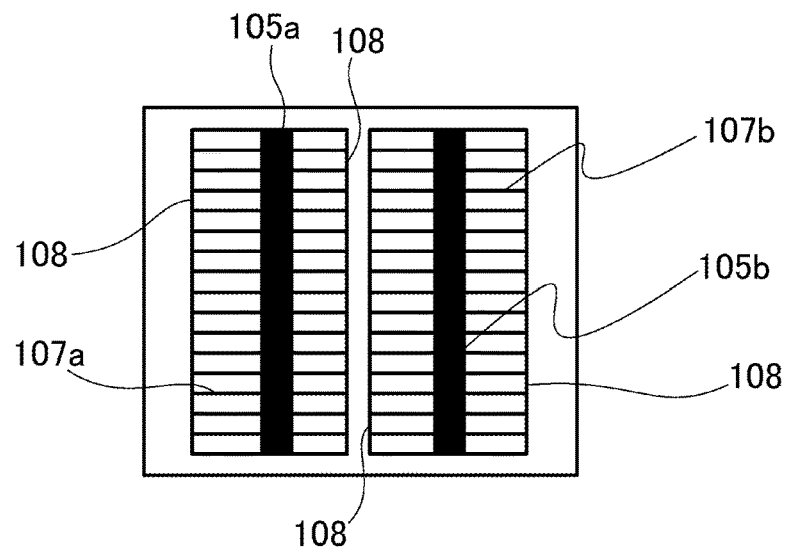
FIG. 5 is a plane view showing an electrode pattern on the front surface of a solar cell in one embodiment of the invention.
Figure 6:
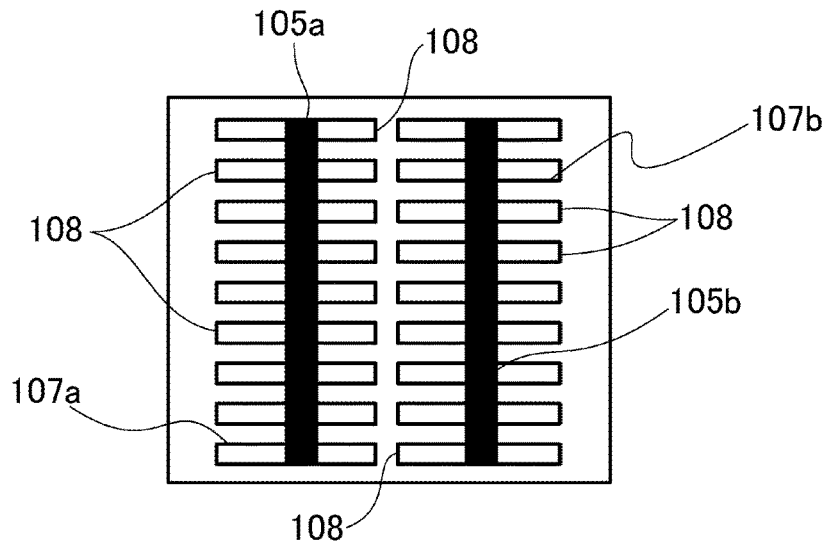
FIG. 6 is a plane view showing an electrode pattern on the front surface of a solar cell in another embodiment of the invention.

In the embodiment shown in FIG. 5, all adjacent distal portions of the finger electrodes 107a, 107b connected to each of the bus bar electrodes 105a, 105b are connected together by the auxiliary electrode 108. In the embodiment shown in FIG. 6, two adjacent distal portions are connected by the auxiliary electrode 108. The mode of connecting adjacent distal portions by the auxiliary electrode 108 is not limited to these embodiments. Also, as shown in FIGS. 5 and 6, the finger electrodes 107a, 107b project from the bus bar electrodes 105a, 105b to which they are connected, in opposite directions orthogonal to the bus bar electrodes 105a, 105b. Preferably at each of opposite ends of finger electrodes 107a (or 107b) projecting from the bus bar electrode 105a (or 105b), longitudinal ends of adjacent finger electrodes 107a (or 107b) are electrically connected together by the auxiliary electrode 108.

It is further preferred in the solar cell of the invention that at a position other than the longitudinal end of the finger electrodes 107a (or 107b), adjacent finger electrodes 107a (or 107b) connected to a common bus bar electrode 105a (or 105b) are electrically connected by another auxiliary electrode 108 which extends orthogonal to the longitudinal direction of the finger electrodes 107 a (or 107b). In this embodiment wherein the additional auxiliary electrode 108 is provided at the position other than the longitudinal end of the finger electrodes (107a or 107b) connected to each bus bar electrode, the number of additional auxiliary electrodes 108 is preferably 1 to 10. Even when only one additional auxiliary electrode 108 is provided, this ensures to suppress a lowering of solar cell fill factor in the event of finger electrodes being broken. Also, if the number of additional auxiliary electrodes 108 exceeds 10, the light receiving area is accordingly reduced, resulting in the reduction in short circuit current and conversion efficiency.

Figure 7:
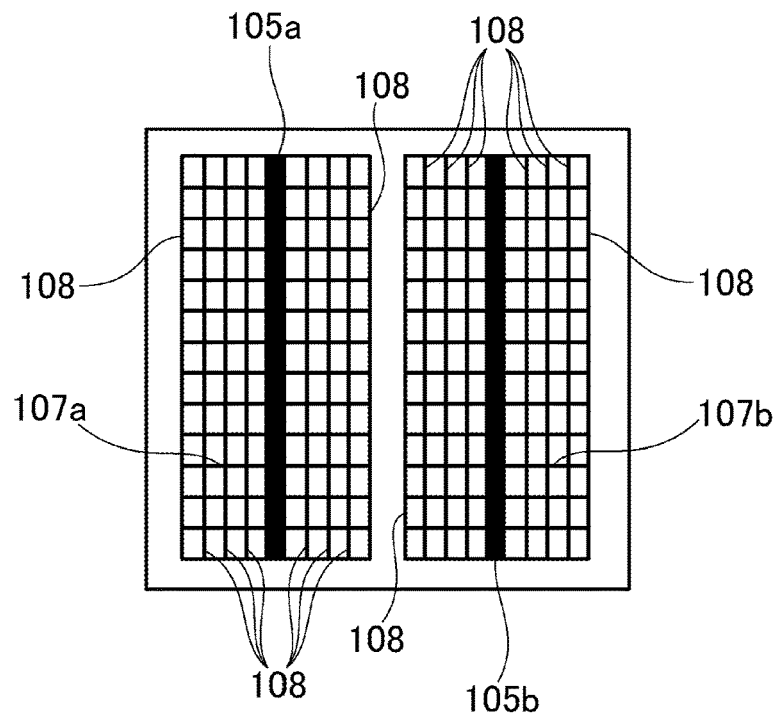
FIG. 7 is a plane view showing a modified example (1) of the electrode pattern on the front surface of the solar cell of FIG. 5.
Figure 8:
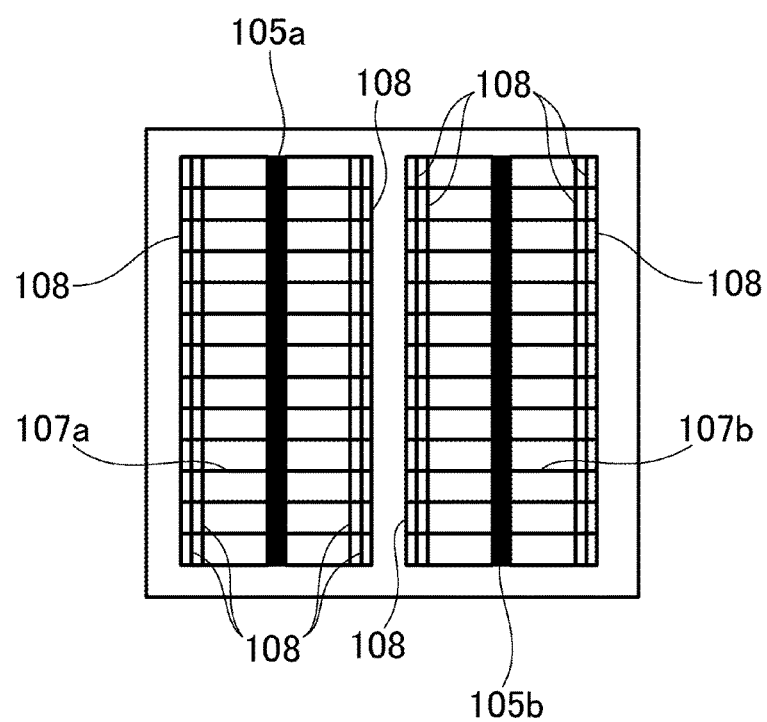
FIG. 8 is a plane view showing a modified example (2) of the electrode pattern on the front surface of the solar cell of FIG. 5.

FIGS. 7 and 8 shows the embodiments wherein additional auxiliary electrodes 108 are provided at positions other than the longitudinal end (or distal portion) of the finger electrodes 107a, 107b, in the electrode pattern of FIG. 5.

In the embodiment of FIG. 7, in addition to the auxiliary electrodes 108 provided at the distal portions of finger electrodes 107a, 107b, three auxiliary electrodes 108 extending orthogonal to the longitudinal direction of finger electrodes 107a are provided on each side such that they are equally spaced between the distal portions of finger electrodes 107a and the bus bar electrode 105a, for connecting the finger electrodes 107a all together; and three auxiliary electrodes 108 extending orthogonal to the longitudinal direction of finger electrodes 107b are provided on each side such that they are equally spaced between the distal portions of finger electrodes 107b and the bus bar electrode 105b, for connecting the finger electrodes 107b all together.

This embodiment reduces the conductive paste necessary to form auxiliary electrodes to the requisite minimum and is effective for suppressing any reduction of the solar cell fill factor even if by any chance finger electrodes are broken. The embodiment of FIG. 7 also has the advantage that if a finger electrode is broken at any position, the distance from the broken site to the auxiliary electrode is so short that the reduction of fill factor is minimized.

In the embodiment of FIG. 8, in addition to the auxiliary electrodes 108 provided at the distal portions of finger electrodes 107a, 107b, two auxiliary electrodes 108 extending orthogonal to the longitudinal direction of finger electrodes 107a, 107b are provided in proximity to the distal portions of finger electrodes 107a, 107b, for connecting the finger electrodes 107a all together and connecting the finger electrodes 107b all together. The proximity to the distal portions of finger electrodes 107a, 107b indicates a region that is deviated from an intermediate point between the distal portion of finger electrode and the bus bar electrode toward the distal portion of finger electrode, preferably a region that extends within a distance of L/3 from the distal portion of finger electrode wherein L is the distance between the distal portion and the bus bar electrode, and more preferably a region that extends within a distance of L/4 from the distal portion of finger electrode wherein L is the distance defined above.

This embodiment reduces the conductive paste necessary to form auxiliary electrodes to the requisite minimum and is effective for suppressing any reduction of the solar cell fill factor even if by any chance finger electrodes are broken. The invention relies on an electrode printing method of forming bus bar electrodes, finger electrodes, and auxiliary electrodes at a time by screen printing technique. At this point, the printing direction is generally set parallel to the finger electrodes and orthogonal to the bus bar electrodes and auxiliary electrodes. This is because the screen printing technique is difficult to print lines orthogonal to the printing direction, with the risk that such lines may be thinned or broken. When auxiliary lines are closely arranged as shown in FIG. 8, the resulting auxiliary electrodes can compensate for breakage or thinning. Thickened auxiliary electrodes, though possible to print, are undesirable because the light receiving area is reduced.

Although the electrode patterns of FIGS. 7 and 8 are shown as modified examples of FIG. 5, they may be applied to the electrode pattern of FIG. 6.

Also, when adjacent distal portions are connected by an auxiliary electrode, the auxiliary electrode is not limited to the linear connection orthogonal to the longitudinal direction of finger electrodes as shown in FIGS. 5 to 8. A connection method using a connector of a curved shape which is convex outward of the longitudinal direction of finger electrodes between two finger electrodes to be connected is acceptable. That is, the auxiliary electrode may be a connector of an arc shape (arch shape) or a mountain-type protrusion (pseudo-arcuate shape) consisting of short linear segments connecting between the ends of two adjacent or close finger electrodes, so that the connection angle between the auxiliary electrode and the finger electrode (angle formed between auxiliary electrode and finger electrode) is not orthogonal.

It is noted that the bus bar electrode is preferably formed to a line width of 0.5 to 3.0 mm, more preferably 1.0 to 1.5 mm. The finger electrode is preferably formed to a line width of 30 to 120 µm, more preferably 60 to 120 µm, and most preferably 70 to 100 µm. The auxiliary electrode is preferably formed to a line width of 30 to 500 µm, more preferably 60 to 500 µm, even more preferably 60 to 360 µm, and most preferably 70 to 240 µm. The spacing between bus bar electrodes is preferably 20 to 100 mm, more preferably 39 to 78 mm. The spacing between finger electrodes is preferably 0.5 to 4.0 mm, more preferably 1.5 to 2.5 mm.

The ratio of the line width of auxiliary electrode to the line width of finger electrode is preferably from 0.5 to 8.0, more preferably from 0.5 to 2.5. A ratio of less than 0.5 may invite difficult fabrication of a screen printing plate and a likelihood of breakage whereas a ratio in excess of 8.0 may cause a reduction in light receiving area and hence, a lowering of conversion efficiency.

The solar cell of the invention as shown in FIG. 1 may be manufactured by any well-known methods. Herein, bus bar electrodes, finger electrodes and auxiliary electrodes may be formed by the screen printing method. Desirably these electrodes are simultaneously formed by the screen printing method. This gives advantages of reducing the manufacturing cost by a single printing step and improving the manufacture yield by the reduction in cracking or fissure due to the reduced number of steps capable of applying stress to the semiconductor substrate. The invention is also applicable to a solar cell wherein finger electrodes and bus bar electrodes are formed on the rear side, that is, bifacial solar cell.

When the electrode pattern according to the invention is used, not only the warpage of the substrate is minimized, but the following advantages are also achieved.

First, even when a certain finger electrode is broken during thermal history as by a thermal cycling test, because the end of that broken finger electrode is connected to the end of another finger electrode by the auxiliary electrode, current flow can be taken out via the other finger electrode, avoiding any power loss. Second, since the auxiliary electrode is connected to the ends of finger electrodes, the contact area with the semiconductor substrate at the finger electrode end is enlarged, whereby the adhesive strength of the finger electrode end is improved to prevent the finger electrode from peeling during long-term service. Third, the same prevents the finger electrode end from peeling from the semiconductor substrate upon thermal shrinkage after firing. Fourth, the auxiliary electrodes serve to reduce the line resistance, leading to increased fill factor and improved conversion efficiency. Fifth, the provision of auxiliary electrodes maintains a high conversion efficiency in that a loss of short circuit current density (Jsc) associated with a reduction of light receiving area is offset by an increase of fill factor.

The advantages of the invention are also available from a solar cell module.

When the solar cell is exposed to an outdoor environment, the current-collection electrode is damaged by the impact of temperature, humidity, pressure or the like, resulting in the decrease in the conversion efficiency. When dust and foreign particles which are not transmissive to light deposit on the light-receiving surface, they interfere with entry of sunlight, inviting the substantial decrease in conversion efficiency. Thus, in the prior art, a laminate of the order of transparent front-side cover (e.g., colorless strengthened glass plate)/fill (e.g., ethylene-vinyl acetate=EVA)/solar cell/fill (e.g., EVA)/weather resistant back-side cover of resin film (e.g., polyethylene terephthalate=PET) is bonded under heat and pressure, yielding a solar cell module which is constructed so as to minimize the loss of conversion efficiency. Even the solar cell module constructed as above, however, when exposed to a severe outdoor environment for many years, tends to decrease its conversion efficiency gradually. Among others, the electrodes are corroded with moisture and allow metal particles to be leached out in moisture, in some cases, and if so, they weaken their bond to the semiconductor substrate and eventually peel off.

The above and other problems are solved using the solar cell of the invention because the adhesive strength of finger electrode ends is increased.

Figure 9:
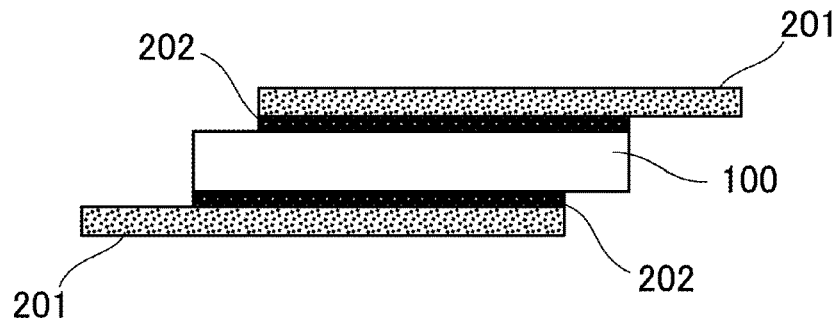
FIG. 9 is a schematic cross-sectional view showing the basic construction of a conventional solar cell module.

The solar cell module of the invention is constructed using the solar cells of the invention. As shown in FIG. 9, a plurality of solar cells are electrically connected by soldering conductors or interconnectors 201 to their bus bar electrodes. In the illustrated embodiment, interconnectors 201 are connected to front bus bar electrode 105 and rear bus bar electrode 106 on the solar cell 100 via solders 202.

The solar cell module of the invention is obtained by arranging a plurality of solar cells 100 of the illustrated construction along the longitudinal direction of bus bar electrodes 105, with their light-receiving surfaces faced in an identical direction, and connecting a front bus bar electrode 105 of one solar cell 100 to a rear bus bar electrode 106 of an adjacent solar cell 100 via an interconnector 201. The number of solar cells connected is typically 2 to 60.

In general, the front and back surfaces of solar cells in the solar cell module should be protected. A solar cell module product is thus constructed such that a plurality of solar cells with interconnectors 201 as illustrated above are sandwiched between a transparent substrate such as glass plate and a back cover such as a back-sheet. In this case, a super-straight system is generally employed, for example, wherein a plurality of solar cells 100 with interconnectors 201 are sandwiched between the transparent substrate and the back cover, with their light-receiving surfaces facing the transparent substrate, and encapsulated with a transparent fill material such as polyvinyl butyrol (PVB) having a minimal loss of light transmittance or ethylene vinyl acetate (EVA) having improved moisture resistance, and external terminals are connected thereto. Herein, an external extracting interconnector connected to the rear bus bar electrodes 106 of solar cells 100 is connected to one external terminal, and an external extracting interconnector connected to the front bus bar electrodes 105 of solar cells 100 is connected to the other external terminal.

EXAMPLES

Examples and Comparative Examples are given below by way of illustration of the invention, but not by way of limitation.

Examples 1 and 2 and Comparative Examples 1 and 2

To confirm the effectiveness of the invention, solar cells 100 as shown in FIGS. 2, 4, 5 and 6 were fabricated by processing 400 semiconductor substrates through the following steps.

First, there were furnished boron-doped {100} p-type silicon substrates 100b as sliced of 15 cm squares and 250 μm thick, having a resistivity of 2.0 Ω·cm. The substrate was treated with a conc. potassium hydroxide aqueous solution to remove the damaged layer, textured, heat treated in a phosphorus oxychloride atmosphere at 850° C. to form an n-type diffusion layer 101, treated with hydrofluoric acid to remove phosphorus glass, cleaned, and dried. Next, using a plasma-enhanced CVD system, SiNx was deposited as an antireflection coating layer 102. On the rear side, a paste obtained by mixing silver powder and glass frit with an organic binder was screen-printed in a bus bar pattern for rear bus bar electrode 106. Thereafter, a paste obtained by mixing aluminum powder with an organic binder was screen-printed in a region except on the previously printed bus bar pattern, for aluminum electrode 104. The organic solvent was dried off, yielding the semiconductor substrate having rear electrodes formed thereon.

Next, on the semiconductor substrate, a conductive paste containing silver powder, glass frit, organic vehicle and organic solvent as main components and metal oxide as additive was printed on the antireflection coating layer 102 on the semiconductor substrate through a screen under such conditions as squeezer rubber hardness 70°, squeezer angle 70°, printing pressure 0.3 MPa, and printing speed 50 mm/sec. After printing, the paste was dried in a clean oven at 150° C. to remove the organic solvent, and fired at 800° C. in an air atmosphere, yielding the solar cell 100.

Two bus bar electrodes were formed with a spacing of 78 mm (in case of three bus bar electrodes, 52 mm) and a line width of 1.5 mm. Finger electrodes had a line width of 90 μm and a mutual spacing of 2.0 mm. Auxiliary electrodes had a line width of 120 μm.

Four hundred (400) solar cells thus fabricated were evaluated by the following tests.

(1) Electric Properties

Solar cell electric properties were evaluated by using a solar simulator (model YSS-160A by Yamashita Denso Corp.). I-V characteristics were measured by irradiating simulated sun light from the simulator to a solar cell sample (substrate temperature 25° C., irradiance 1 kW/m$^2$, spectrum AM 1.5 global). From the data, fill factor, short-circuit current density and conversion efficiency were computed. The measurement was reported as an average of 100 solar cell samples for each Example.

(2) Warpage of Solar Cell

Figure 10:
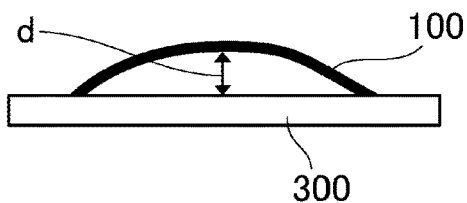
FIG. 10 illustrates how to evaluate warpage of a solar cell.

Warpage of a solar cell was evaluated as shown in FIG. 10. In the measurement, a solar cell sample 100 was set on a platform 300, and the distance "d" from the topmost of the sample to the platform 300 was measured.

The results are shown in Table 1.

TABLE 1

Figure 2:
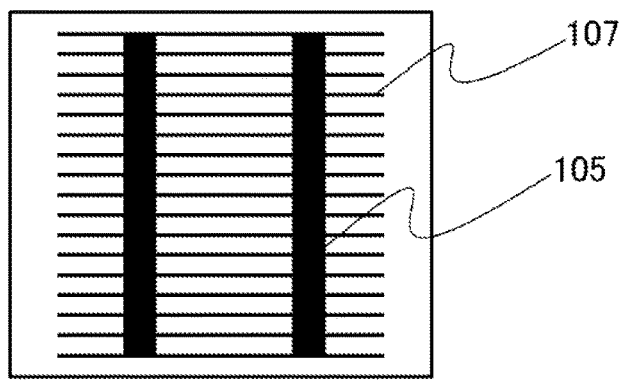
FIG. 2 is a plane view showing an electrode pattern on the front surface of the conventional solar cell.
Figure 3:
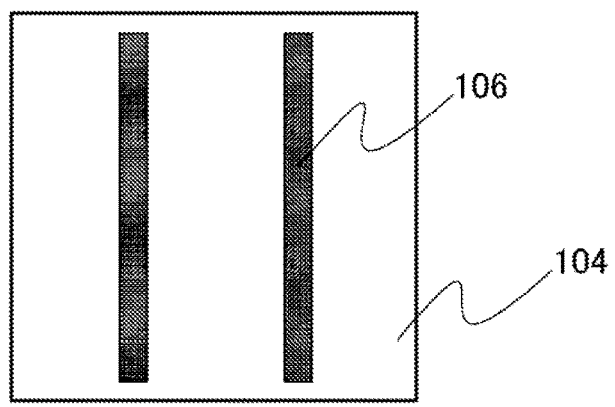
FIG. 3 is a plane view showing an electrode pattern on the back surface of the conventional solar cell.
Figure 4:
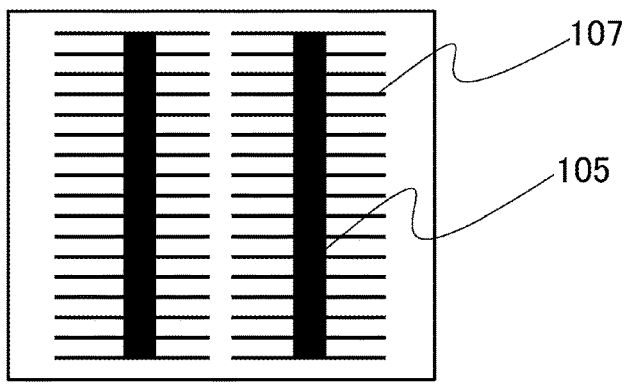
FIG. 4 is a plane view showing an electrode pattern on the front surface of a prior art solar cell.

|  | Comparative Example 1 | Comparative Example 2 | Example 1 | Example 2 |
|---|---|---|---|---|
| Electrode pattern | FIG. 2 | FIG. 4 | FIG. 5 | FIG. 6 |
| Electrode area ratio | 1.00 | 0.97 | 1.03 | 1.00 |
| Electrode cost ratio | 1.00 | 0.97 | 1.03 | 1.00 |
| Short-circuit current density (mA/cm$^2$) | 35.9 | 36.2 | 35.8 | 35.9 |
| Fill factor (%) | 75.0 | 73.0 | 78.0 | 77.9 |
| Conversion efficiency (%) | 16.7 | 16.4 | 17.5 | 17.5 |
| Cell warpage (mm) | 3.0 | 0.5 | 0.5 | 0.5 |

In Comparative Examples, short-circuit current increased because the electrode area on the light-receiving surface was reduced which means that the amount of sunlight entering the substrate was accordingly increased. However, the line resistance of solar cell increased due to breakage of finger electrodes and peeling of finger electrode ends, resulting in a reduction in fill factor.

By contrast, the electrode patterns of Examples 1 and 2 demonstrate that even when the electrode area is increased as in Example 1, the reduction in short circuit current is less and the fill factor increases remarkably. This leads to a 0.8% increase in conversion efficiency over Comparative Example 1.

Next, using the solar cells fabricated in Examples 1 and 2 and Comparative Examples 1 and 2, modules were manufactured by the following procedure.

A linear interconnector 201 of 2 mm wide and 0.2 mm thick was used. As shown in FIG. 9, flux was previously applied to the region for connection between interconnector 201 and bus bar electrode 105, and the interconnector 201 was solder-connected to the bus bar electrode 105 on the light-receiving surface of the solar cell. Likewise, an interconnector 201 was soldered to the rear bus bar electrode 106 of the solar cell. Next, components were stacked in the order of colorless strengthened glass/ethylene vinyl acetate (EVA)/interconnected solar cell 100/EVA/polyethylene terephthalate (PET). By vacuuming the ambient atmosphere, heat/pressure bonding at a temperature of 150° C. for 10 minutes to make them a module. Furthermore, this module was post-annealed at 150° C. for 1 hour to completely cure. Herein 60 solar cells were connected to each other by interconnectors 201 and encapsulated.

By the foregoing procedure, the solar cell modules were manufactured.

A thermal cycling test (JIS C8917) was performed on each of the solar cell modules manufactured using the solar cells of Examples 1 and 2 and Comparative Examples 1 and 2, comparing the output of the solar cell module before and after the test. The thermal cycling test included 400 cycles under the conditions according to JIS C8917 standards. Specifically, the test includes heating from room temperature (25° C.) to 90° C. at a rate of up to 87° C./hr, holding at the temperature (90° C.) for 10 minutes, then cooling down to −40° C. at a rate of up to 87° C./hr, holding at the temperature (−40° C.) for 10 minutes, and heating up to 25° C. at a rate of up to 87° C./hr. Provided that these steps are one cycle (3 hours 20 minutes), the test repeated 400 cycles. The output of the solar cell module was measured by the aforementioned solar simulator under light exposure at AM 1.5 and 100 mW/cm$^2$, whereupon a percent output retention=(output after test)/(output before test)×100% was computed. The results are shown in Table 2.

TABLE 2

|  | Comparative Example 1 | Comparative Example 2 | Example 1 | Example 2 |
|---|---|---|---|---|
| Output retention | 77% | 54% | 99% | 97% |

As seen from the results, after 400 cycles of the thermal cycling test, the solar cell module using the solar cells of Comparative Example 1 showed an output drop to 77%. In the solar cell module using the solar cells of Comparative Example 2, the output dropped to 54%.

The solar cell module using the solar cells of Example 1 showed an output retention of 99%. The solar cell module using the solar cells of Example 2 showed an output retention of 97%. No significant output drops could be found.

Example 3

Figure 11:
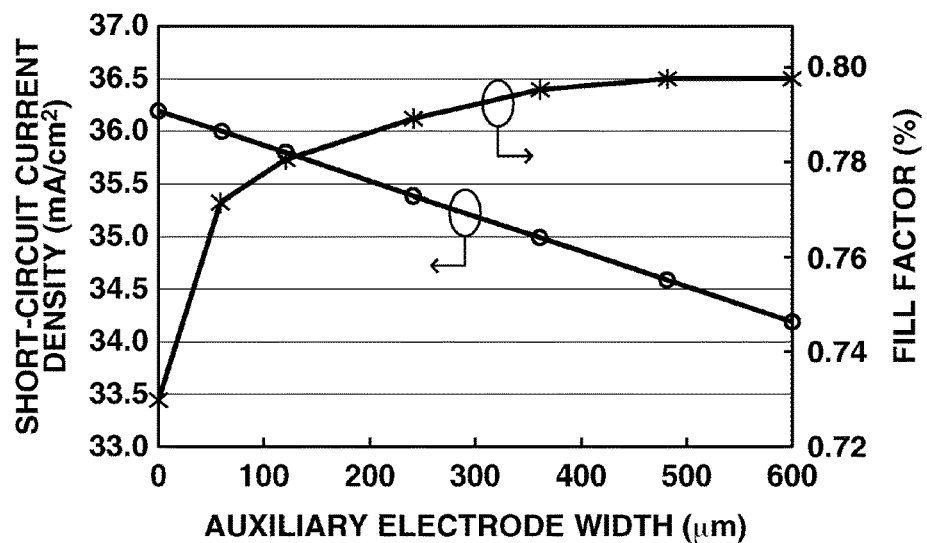
FIG. 11 is a diagram showing short circuit current density and fill factor in Example 3.
Figure 12:
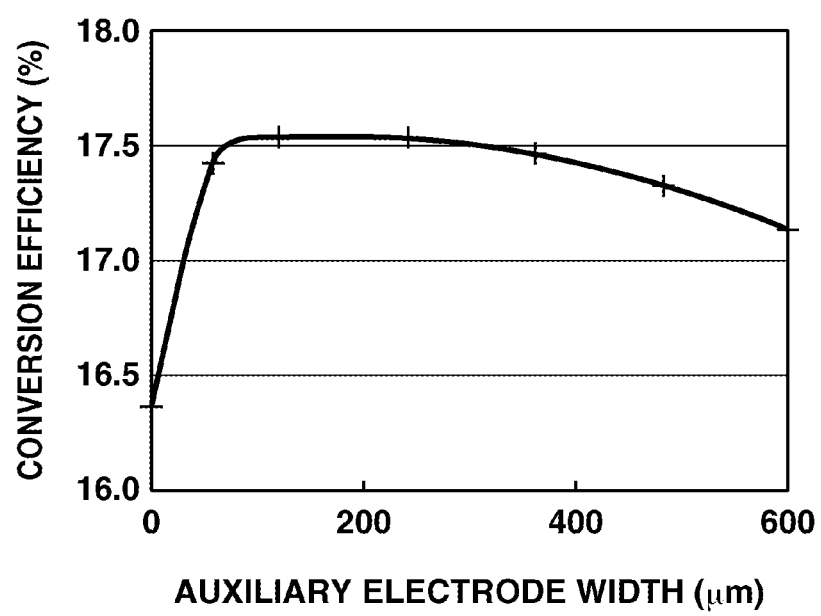
FIG. 12 is a diagram showing conversion efficiency in Example 3.

Properties of the solar cell of Example 1 (structure of FIG. 5) were measured while the line width of auxiliary electrodes was changed. Specifically, solar cells were fabricated under the same conditions as in Example 1 except that the line width of auxiliary electrodes was changed to 0 (no auxiliary electrode), 60, 120, 240, 360, 480, and 600 μm. Electric properties of the solar cells were measured under the same measurement conditions as in Example 1. The measurements of short-circuit current density and fill factor are shown in FIG. 11 and the measurements of conversion efficiency are shown in FIG. 12.

In the absence of auxiliary electrodes (line width 0 μm), a high short-circuit current and remarkably low fill factor were observed, while the fill factor and conversion efficiency were substantially improved by the provision of auxiliary electrodes. In the region where the line width of auxiliary electrodes is 60 to 500 μm, as the line width increases, the short-circuit current decreases and the fill factor increases. A tradeoff relationship between short-circuit current and fill factor is observed (FIG. 11) and a certain high conversion efficiency is maintained (FIG. 12). When the line width of auxiliary electrodes exceeds 500 μm, the reduction in short-circuit current becomes substantial due to the shadow loss of auxiliary electrodes (FIG. 11) and the conversion efficiency drops (FIG. 12) while the fill factor little increases.

These results show that an optimum line width of auxiliary electrodes is 60 to 500 μm in the inventive solar cell.

REFERENCE SIGNS LIST 100 solar cell
100b p-type semiconductor substrate
101 n-type diffusion layer
102 antireflection coating layer
103 BSF layer
104 aluminum electrode
105, 105a, 105b bus bar electrode
106 rear bus bar electrode
107, 107a, 107b finger electrode
108 auxiliary electrode
201 interconnector
202 solder

The invention claimed is:

1. A method for manufacturing a solar cell comprising a semiconductor substrate having at least a pn junction formed therein, an antireflection coating layer on a light-receiving surface of the semiconductor substrate, a multiplicity of finger electrodes for current collection which are formed in comb shape on the light-receiving surface of the semiconductor substrate and bonded to the semiconductor substrate, a plurality of bus bar electrodes for collecting current from the finger electrodes which extend orthogonal to the longitudinal direction of the finger electrodes and are connected to the finger electrodes, and rear electrodes on a rear surface of the semiconductor substrate, comprising rear bus bar electrodes for current collection on the rear side without finger electrodes, the rear bus bar electrodes extending the same direction as the longitudinal direction of the bus bar electrodes on the light-receiving surface,
    wherein the semiconductor substrate is of silicon and has a thickness of less than 500 μm, first finger electrodes which are joined and connected to a first bus bar electrode are spaced apart from second finger electrodes which are joined and connected to a second bus bar electrode extending parallel with the first bus bar electrode, the first and second finger electrodes project from the first and second bus bar electrodes to which they are joined and connected, respectively, in opposite directions orthogonal to the first and second bus bar electrodes, and at each of the opposite ends of the first and second finger electrodes projecting from the bus bar electrodes, an auxiliary electrode is joined and connected to longitudinal ends of all adjacent finger electrodes whereby longitudinal ends of all adjacent finger electrodes are electrically connected together by the auxiliary electrode:

the method comprising forming the antireflection coating layer on the light-receiving surface of the semiconductor substrate, screen printing a rear electrode pattern comprising the rear bus bar electrodes without finger electrodes with a rear surface conductive paste containing silver powder, glass frit, organic vehicle and organic solvent on a rear surface of the semiconductor substrate, screen printing by using a screen printing plate having an electrode pattern of the bus bar electrodes, the finger electrodes, and the auxiliary electrodes on the antireflection coating layer with a light-receiving side conductive paste containing silver powder, glass frit, organic vehicle and organic solvent, drying the rear surface conductive paste on the rear surface of the semiconductor substrate and the light-receiving side conductive paste on the light-receiving surface side of the semiconductor substrate, and firing the printed rear surface conductive paste and the printed light-receiving side conductive paste at the firing-through temperature of the light-receiving side conductive paste to form the rear bus bar electrodes without finger electrodes, the bus bar electrodes, the finger electrodes and the auxiliary electrodes of silver sintered body, wherein the finger electrodes and the auxiliary electrodes are bonded to the semiconductor substrate, each finger electrode of the multiplicity of finger electrodes has a width of 30 to 120 µm, and the auxiliary electrodes have a width of 60 to 360 µm.

2. The method of claim 1, wherein the electrode pattern on the screen printing step further includes 2 to 10 additional auxiliary electrodes, the 2 to 10 additional auxiliary electrodes being on each of the opposite sides of the first and second finger electrodes projecting from the bus bar electrodes, extending orthogonal to the longitudinal direction of the finger electrodes, being spaced between the longitudinal ends of the finger electrodes and the bus bar electrodes, and being joined and connected to all adjacent finger electrodes connected to the first and second bus bar electrodes, respectively, and the screen printing on the antireflection coating layer is conducted by using the screen printing plate having said electrode pattern of the bus bar electrodes, the finger electrodes, the auxiliary electrodes and the 2 to 10 additional auxiliary electrodes at one time.

3. The method of claim 2 wherein said additional 2 to 10 auxiliary electrodes are equally spaced between the longitudinal ends of the finger electrodes and the bus bar electrodes.

4. The method of claim 2 wherein said additional 2 to 10 auxiliary electrodes are spaced apart from each other within a distance of L/3 from the longitudinal ends of the finger electrodes, wherein L is the distance between the longitudinal end of the finger electrode and the bus bar electrode.

5. The method of claim 1 wherein the spacing between the first bus bar electrode and the second bus bar electrode is 20 to 100 mm.

6. The method of claim 1 wherein the first finger electrodes are not joined to the second finger electrodes.

7. The method of claim 2 in which the screen printing direction is set parallel to the finger electrodes and orthogonal to the bus bar electrodes and auxiliary electrodes.

8. The method of claim 1 wherein the auxiliary electrode is a sintered body connected to the ends of the finger electrodes, whereby the adhesive strength of the finger electrode end is improved to prevent the finger electrode from peeling during service.

9. The method of claim 1, wherein a ratio of the line width of the auxiliary electrode to the line width of one of the finger electrodes is from 0.5 to 8.0.

10. The method of claim 1, wherein the auxiliary electrode is a sintered body connected to the ends of the finger electrodes, whereby the adhesive strength of the finger electrode end is improved to prevent the finger electrode end from peeling from the semiconductor substrate upon thermal shrinkage after firing.

11. The method of claim 1 further comprising before the step of drying and firing the printed rear surface conductive paste of the rear electrode pattern and the printed light-receiving side conductive paste on the antireflection coating layer, a step of screen printing another rear electrode pattern with a paste obtained by mixing aluminum powder with an organic binder in a region except on the rear bus bar electrode pattern of the rear surface of the semiconductor substrate after the screen printing step of the rear surface and before the screen printing step of the light-receiving side, wherein the paste of the another rear electrode pattern is dried and fired with the drying and firing step of the rear surface conductive paste on the rear surface of the semiconductor substrate and the light-receiving side conductive paste on the light-receiving surface side of the semiconductor substrate.

12. The method of claim 1, wherein the semiconductor substrate of silicon has a thickness of 300 µm or less.

13. The method of claim 1, wherein the semiconductor substrate of silicon has a thickness of 250 µm or less.

14. The method of claim 1, wherein the method is for mitigating the warpage of solar cell, wherein the solar cell has a warpage of 0.5 mm or less, when the semiconductor substrate of silicon is 15 cm squares and 250 µm thick.

* * * * *